United States Patent [19]
Matsueda

[11] Patent Number: 5,886,335
[45] Date of Patent: Mar. 23, 1999

[54] MANUAL SCANNING APPARATUS FOR READING AN OPTICAL CODE REPRESENTING MULTIMEDIA INFORMATION

[75] Inventor: Akira Matsueda, Tachikawa, Japan

[73] Assignee: Olympus Optical Co., Ltd., Tokyo, Japan

[21] Appl. No.: 723,092

[22] Filed: Sep. 30, 1996

[30] Foreign Application Priority Data

Oct. 3, 1995 [JP] Japan ..................... 7-256330

[51] Int. Cl.⁶ ............................................. G06K 07/10
[52] U.S. Cl. ...................... 235/436; 235/472; 235/454; 235/460
[58] Field of Search ................... 235/436, 472, 235/454, 460

[56] References Cited

U.S. PATENT DOCUMENTS

| | | | |
|---|---|---|---|
| 3,970,803 | 7/1976 | Kinzie, Jr. et al. | 179/100.3 |
| 4,570,250 | 2/1986 | Gabritsos et al. | 369/97 |
| 5,101,096 | 3/1992 | Ohyama et al. | 235/436 |

FOREIGN PATENT DOCUMENTS

| | | |
|---|---|---|
| 0 354 581 A2 | 2/1990 | European Pat. Off. . |
| 0 670 555 A1 | 9/1995 | European Pat. Off. . |
| 0 717 398 A3 | 6/1996 | European Pat. Off. . |
| WO 85/02284 | 5/1985 | WIPO . |

OTHER PUBLICATIONS

Electronics & Communications in Japan, Part II –Electronics, vol. 75, No. 4, Apr. 1, 1992, pp. 73–84, Shinji Ohyama et al, "Optical Sheet Memory System".

Patent Abstracts of Japan, vol. 014, No. 076 (P–1005), Feb. 13, 1990 & JP-A-01 292483 (Fuji Xerox Co., Ltd.).

Patent Abstracts of Japan, vol. 017, No. 471 (P–1601), Aug. 26, 1993 & JP-A-05 109068 (Wacom Co., Ltd.).

Patent Abstracts of Japan, vol. 015, No. 342 (P–1244), Aug. 29, 1991 & JP-A-03 137341 (Hitachi Ltd.).

*Primary Examiner*—Anita Pellman Gross
*Assistant Examiner*—Douglas X. Rodriguez
*Attorney, Agent, or Firm*—Frishauf, Holtz, Goodman, Langer & Chick

[57] ABSTRACT

A code read apparatus optically reads, by manual scanning, a two-dimensional code recorded on a recording medium. The code comprises a plurality of blocks having dot patterns arranged in accordance with multimedia information. An area sensor of an imaging section of the code read apparatus outputs an image signal in accordance with a clock signal generated by a clock generator. The area sensor is constructed and the clock signal is determined such that a maximum scan speed V of 160 mm/s to 200 mm/s, at which the code can be read at the time of manual scanning, is achieved, the maximum scan speed being given by $$V = \frac{(m-1)lm}{t} \quad (1)$$

where m=the number of blocks in one imaging screen in the scan direction, lm=the length of one block in the scan direction, and t=the imaging cycle.

5 Claims, 6 Drawing Sheets

| BLOCK SIZE | | NUMBER OF BLOCKS IN ONE SCREEN | | IMAGING TIME INTERVAL (t) |
| --- | --- | --- | --- | --- |
| WIDTH DIRECTION ($\ell n$) | LENGTH DIRECTION ($\ell m$) | LENGTH DIRECTION (m) | WIDTH DIRECTION (n) | |
| 1mm | 1mm | 4 | 3 | 16.7ms |

FIG. 7

| BLOCK LENGH ($\ell m$; mm) | NUMBER OF BLOCKS (m) | IMAGING TIME INTERVAL (t; ms) | SPEED (mm/s) |
| --- | --- | --- | --- |
| 1 | 4 | 20 | 150 |
| 1 | 4 | 18 | 167 |
| 1 | 4 | 16.7 | 180 |
| 1 | 4 | 15 | 200 |
| 1 | 4 | 14 | 214 |

FIG. 8

| BLOCK LENGH ($\ell m$; mm) | NUMBER OF BLOCKS (m) | IMAGING TIME INTERVAL (t; ms) | SPEED (mm/s) |
| --- | --- | --- | --- |
| 0.8 | 4 | 12 | 200 |
| 0.8 | 5 | 16 | 200 |
| 1 | 4 | 15 | 200 |
| 1 | 5 | 20 | 200 |
| 1.2 | 4 | 18 | 200 |
| 1.2 | 5 | 24 | 200 |

FIG. 9

MANUAL SCANNING APPARATUS FOR READING AN OPTICAL CODE REPRESENTING MULTIMEDIA INFORMATION

BACKGROUND OF THE INVENTION

1. Field of the Invention

The present invention relates generally to a code read apparatus for reading codes recorded on a recording medium such as paper, and more particularly to a manual scanning code read apparatus for optically reading, by manual scan, code patterns recorded on a recording medium such as paper. Such code patterns are optically readable and represent so-called multimedia information including audio information such as sound and music, video information obtained from a camera, a video apparatus, etc., and digital code data obtained from a personal computer, a word processor, etc. The read code patterns are reproduced as original multimedia information.

2. Description of the Related Art

There is a conventional system for use in reading information recorded on an optical recording medium to thereby reproduce original information.

For example, optical cards and optical (magnetooptical) disks are known as conventional optical recording media. In general, a mechanical scan system, i.e. an automatic scan system, is adopted to scan a detection element over such optical recording media. Specifically, in a system wherein an optical card is used as an optical recording medium, the optical card is reciprocally moved at a predetermined speed, thereby causing the detection element to scan relative to the optical card. In a system wherein an optical (magnetooptical) disk is used, the optical (magnetooptical) disk is rotated at a predetermined speed, thereby causing the detection element to scan.

In general, these conventional detection elements for optical recording media detect an area with a size less than the width of a recording track and less than the interval of recording pits. Specifically, a "point" sensor is moved relative to an optical recording medium to trace the recording track. Thus, "length" information is reproduced as "time" information. In this case, since an error in speed of the optical recording medium is equal to an error in length (interval) of recorded information units, an allowable variation in speed is on the order of several-ten percent or less, The allowable variation, though, depends on variation frequency.

Normally, canceled the speed variation is by adopting a self-clock system in which sync clocks are produced from reproduced data. In fact, however, the degree of allowance is still on the order of several-ten percent.

Accordingly, the optical recording medium must be driven by a servo-controlled driving mechanism, and cannot be driven manually. This results in an increase in cost and size of the apparatus.

On the other hand, a bar-code reader for reading bar codes recorded on a recording medium such as paper is known as a manual scan apparatus. The bar-code reader, too, cannot read bar codes unless the scan speed is within a predetermined range. In addition, since the operator cannot easily make the bar-code reader scan data at a speed within a predetermined speed range, the probability of achieving a successful reading using the manual scan type bar-code reader is not particularly good. Thus, the manual scan type bar-code reader has not been widely accepted in the market.

SUMMARY OF THE INVENTION

The present invention has been made in consideration of the above circumstances, and the object thereof is to provide a code read apparatus capable of achieving manual scanning with an increased degree of freedom with respect to scan speed.

According to an aspect of the invention, there is provided a manual scanning code read apparatus for reading, by manual scan, an optically readable code recorded on a recording medium, said code representing multimedia information including at least one of sound information, image information and text data, said apparatus comprising:

read means for optically reading said code from the recording medium; and process means for processing the code read by the read means and restoring the code to the multimedia information, wherein said read means is constructed such that a maximum scan speed of 160 mm/s to 200 mm/s, at which the code can be read at the time of manual scanning, is achieved.

According to another aspect of the invention, there is provided a manual scanning code read apparatus for reading, by manual scan, an optically readable code recorded on a recording medium, said code representing multimedia information including at least one of sound information, image information and text data, said apparatus comprising:

read means for optically reading said code from the recording medium; and process means for processing the code read by the read means and restoring the code to the multimedia information, wherein said code is a two-dimensional code comprising a plurality of blocks having dot patterns arranged in accordance with the multimedia information, said read means includes an area sensor for imaging the code recorded on the recording medium, and block detection means for detecting the block on the basis of an output from the area sensor, and said read means is constructed such that a maximum scan speed V of 160 mm/s to 200 mm/s, at which the code can be read at the time of manual scanning, is achieved, said maximum scan speed V being given by equation (1), $$V = \frac{(m-1)lm}{t} \quad (1)$$

where m=the number of blocks in one imaging screen in the scan direction, lm=the length of one block in the scan direction, and t=the imaging cycle.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

DETAILED DESCRIPTION OF THE PREFERRED EMBODIMENTS

Prior to a description of one embodiment of the present invention, a description will first be given of a dot code disclosed in EP 0,670,555 A1 (corresponding to U.S. patent application Ser. No. 08/407,018), to which a code read apparatus of the present invention is applied.

The dot code is recorded on an information recording medium such as paper in the form of a two-dimensional code pattern comprising two-dimensionally arranged dots as image information or coded information which can be transmitted by facsimile and copied in large number at low cost. The coded information represents multimedia information including at least one of audio information, video information and digital code data.

Figure 1:
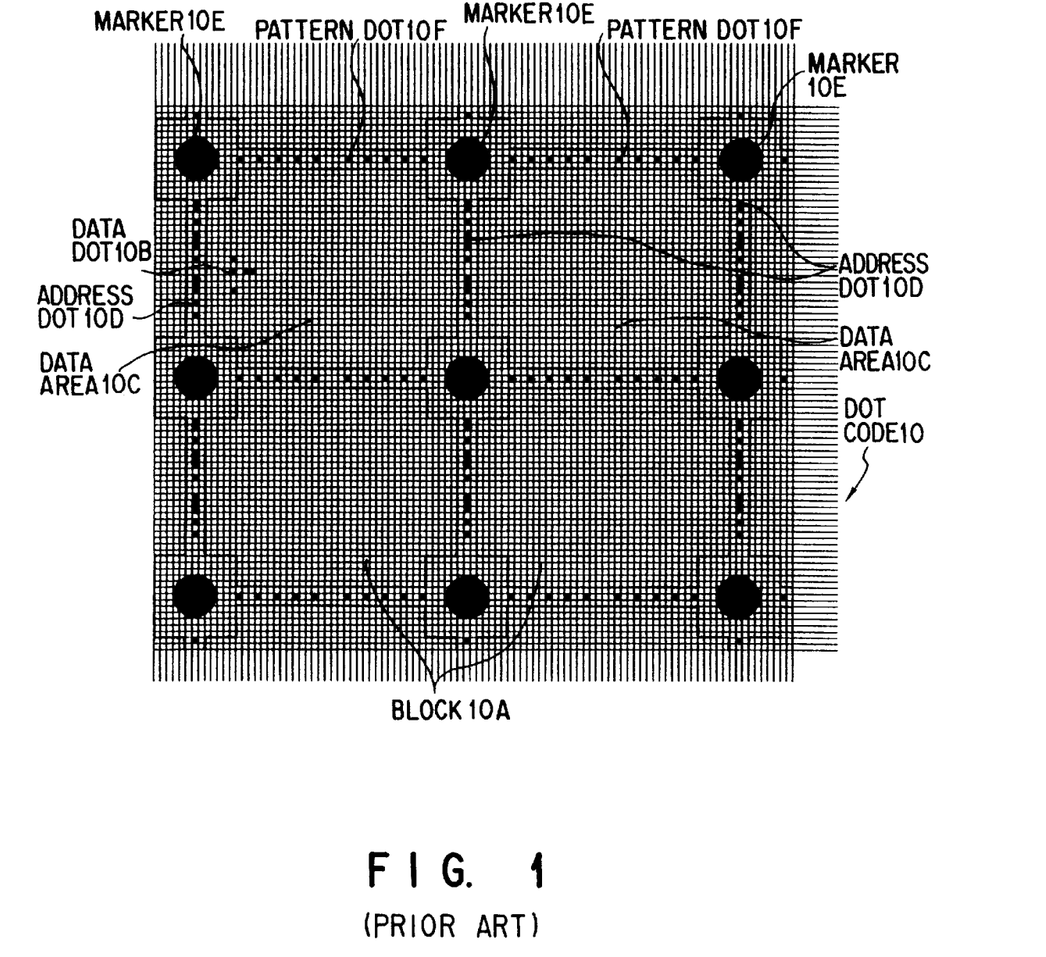
FIG. 1 illustrates a format of a dot code to which a code read apparatus according to the present invention is applied.

Specifically, as shown in FIG. 1, the dot code 10 comprises blocks 10A arranged in a matrix. Each block 10A has data dots of a predetermined unit. Each block 10A includes a data area 10C containing data dots 10B arranged in accordance with the content of information, and block address dots 10D indicative of the address of the associated block, which are arranged in a predetermined relationship with the data area 10C. In addition, each block 10A has markers 10E at predetermined positions, e.g. at four corners, and matching pattern dots 10F arranged in a predetermined relationship with the markers 10E, e.g. between the markers adjacent to each other in a first direction. The address dots 10D are arranged in a predetermined relationship with the markers 10E, e.g. between the markers adjacent to each other in a second direction. Each of the pattern dots 10F, address dots 10D and data dots 10B arranged within the data area 10C has the same size. Each marker 10E is formed as a dot greater in size than the other dots 10F, 10D and 10B. For example, the marker 10E is recorded on the recording medium as a circular dot having a diameter equal to 7 data dots.

A code read apparatus according to an embodiment of the invention for reading the dot code 10 will now be described with reference to the accompanying drawings.

Figure 2A:
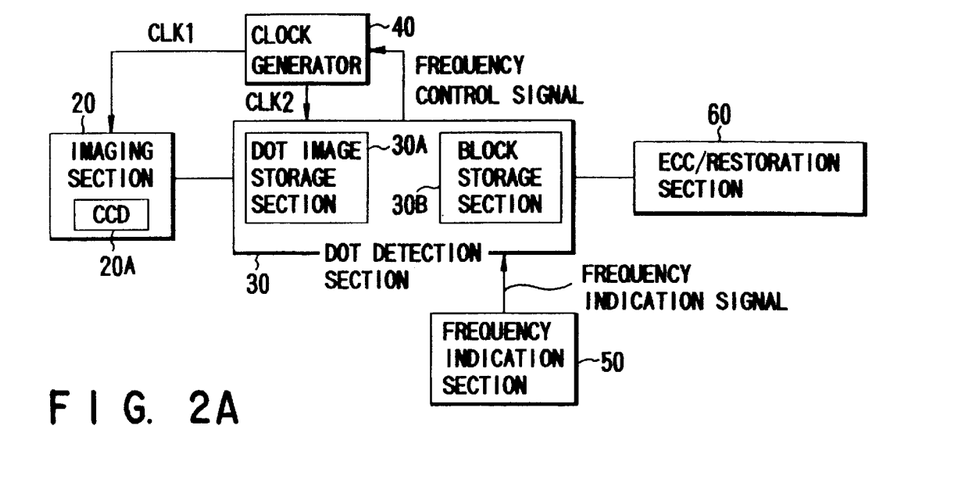
FIG. 2A shows the structure of an embodiment of the invention.
Figure 2B:
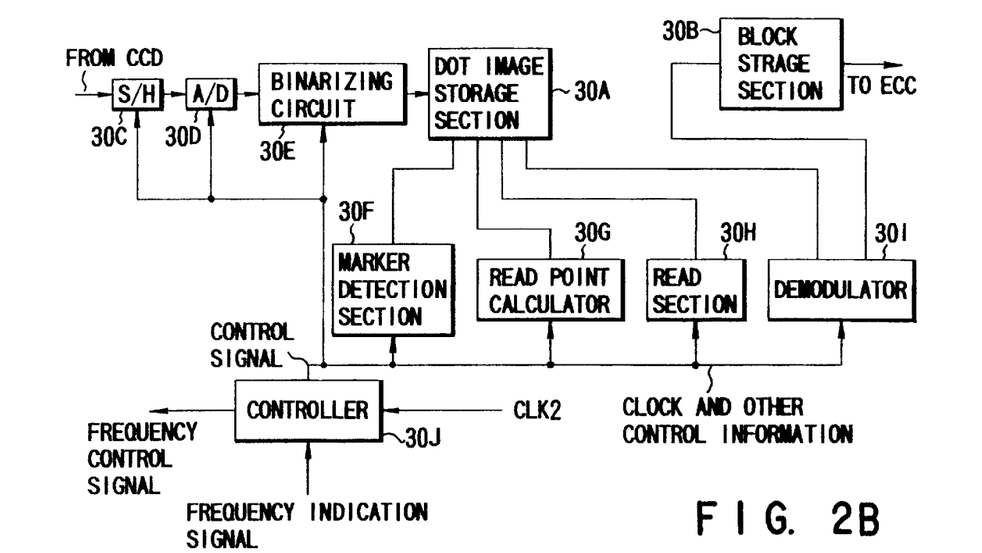
FIG. 2B shows the structure of a dot detection section shown in FIG. 2A.
Figure 2C:
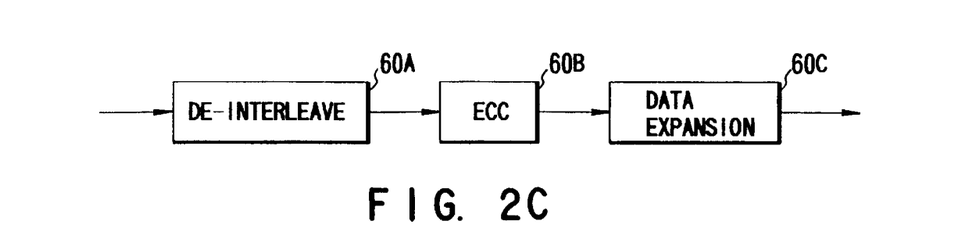
FIG. 2C shows the structure of an ECC/restoration section shown in FIG. 2A.

FIG. 2A shows the structure of this code read apparatus, FIG. 2B shows the structure of a dot detection section shown in FIG. 2A, and FIG. 2C shows the structure of an error correction (ECC)/restoration section shown in FIG. 2A.

A light source (not shown) provided in an imaging section 20 illuminates the dot code 10 recorded on the recording medium, and reflection light is guided through a focusing optical system (not shown) of lenses, etc. and detected as an image signal by an area sensor 20A such as a charge-coupled device (CDD) for converting optical information to an electric signal. The image signal is amplified by a preamplifier (not shown) and output to a dot detection section 30. The area sensor 20A outputs the image signal in accordance with a first clock signal CLK1 generated by a clock generator 40. The imaging cycle can be changed by varying the frequency of the first clock signal CLK1.

The dot detection section 30 comprises two memories, i.e. a dot image storage section 30A and a block storage section 30B, a sample/hold (S/H) circuit 30C, an analog/digital (A/D) converter 30D, a binarizing circuit 30E, a marker detection section 30F, a read point calculator 30G, a read section 30H, a demodulator 30I, and a controller 30J.

Specifically, the image signal output from the imaging section 20 is sampled/held by the S/H circuit 30C and converted to a digital signal by the A/D converter 30D. The digital signal is binarized by the binarizing circuit 30E and then stored in the dot image storage section 30A. The image data stored in the dot image storage section 30A is once read out and fed to the marker detection section 30F. The marker detection section 30F detects the marker 10E of each block. The extraction and detection of the marker is performed by, e.g. erosion process, as disclosed in EP 0,717,398 A3 (corresponding to U.S. patent application Ser. No. 08/571, 776 filed in the U.S. on Dec. 13, 1995) by the same applicant as the present application.

On the basis of the detected marker 10E, the read point calculator 30G detects the pattern dots 10F and detects, by using the pattern dots 10F, the true center of the marker 10E as data read reference point. The address of the block 10A is detected on the basis of the address dots 10D between the true centers of the markers 10E. The distance between the true centers of the markers is divided at predetermined intervals. Thus, the read points of the data dots 10B within the data area 10C of each block are calculated. In accordance with the read points, the read section 30H reads out image data from the dot image storage section 30A. The read-out image data indicates the pattern of the data dots 10B. Since the dot code 10 was subjected to modulation, e.g. 8-10 modulation, at the time of recording, the dot code 10 is subjected to 10-8 demodulation in the demodulator 30I. The demodulated data is stored in the block storage section 30B.

In this case, in accordance with a second clock signal CLK2 (having a predetermined relationship with the first clock signal CLK1) generated from the clock generator 40, the controller 30J produces control signals so that the operations of the S/H circuit 30C, A/D converter 30D, binarizing circuit 30E, marker detection section 30F, read point calculator 30G, read section 30H and demodulator 30I may match with the imaging cycle of the area sensor 20A. The imaging cycle is varied by a frequency indication signal input from a frequency indication section 50. The controller 30J produces a frequency control signal to control the clock generator 40 so that the frequency of the first clock signal CLK1 generated by the clock generator 40 may correspond to the frequency indicated by the frequency indication signal.

The data stored in the block storage section 30B is processed by the ECC/restoration section 60. Specifically, the data read out from the block storage section 30B is first subjected to a de-interleave process in a de-interleave section 60A and then subjected to error correction in an ECC section 60B. In a data expansion section 60C, the data is subjected to an expansion process corresponding to the compression process carried out at the time of recording. The resultant data is output to an output section (not shown). Specifically, if the data is multi-value image information of, e.g. natural image, it is subjected to an expansion process corresponding to, e.g. JPEG. If the data is binary image information of, e.g. handwritten letter or graph, it is subjected to an expansion process corresponding to, e.g. MR/MH/MMR. When the data is a character or a line, it is first subjected to Huffman coding, Lempe-Ziv coding, etc. and then converted to display data. In the output section, the display data is converted to an analog signal and displayed on a display such as a CRT (TV monitor). If the data is sound information, it is subjected to an expansion process corresponding to, e.g. ADPCM. In the output section, the expanded data is converted to an analog signal and the analog signal is supplied to a speaker, a headphone, or other sound output equipment. Needless to say, the character data or line data may be directly output to a page printer, a plotter, etc. The character data may be printed on paper as word-processed character, and the line data may be plotted as line image or figure.

In the above code read apparatus, at least the imaging section 20 is constituted as scan section housed in a pen-like housing which is designed for manual scanning operation.

The manual scan operation is performed in a manner similar to the manner in which a line is drawn freehand by means of a pencil, etc.

Generally speaking, an adult person with no special skill draws a line freehand at a speed of about one hundred and several-ten mm/s. The length of a line which can be drawn smoothly in one stroke is normally about 20 cm. This length corresponds to the width of "A4" sheet placed vertical. In the case of child, the speed of drawing is lower and about several-ten mm/s.

In the case of a code read apparatus of the type in which strip-like dot code 10 is manually scanned by the pen-type scanner, the allowable scan speed range is determined based on the above values in consideration of easy operations for the user.

Figure 3A:
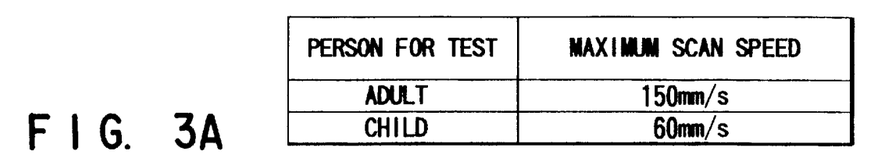
FIGS. 3A to 3C illustrate, respectively, experimental data on maximum scan speed, variance and a histogram of variance.

FIG. 3A shows experimental data on the speed for scanning the dot code 10 by means of the pen-type scanner. The data values may vary depending on the friction between the read surface and the scanner. In the experiments, general conditions were set for the dot code 10. Specifically, the dot code 10 was recorded by ink on a paper sheet with smooth surface. The size of one dot is several-ten $\mu$m. The area of contact between the scanner and paper sheet is up to 2 cm$^2$.

Figure 3B:
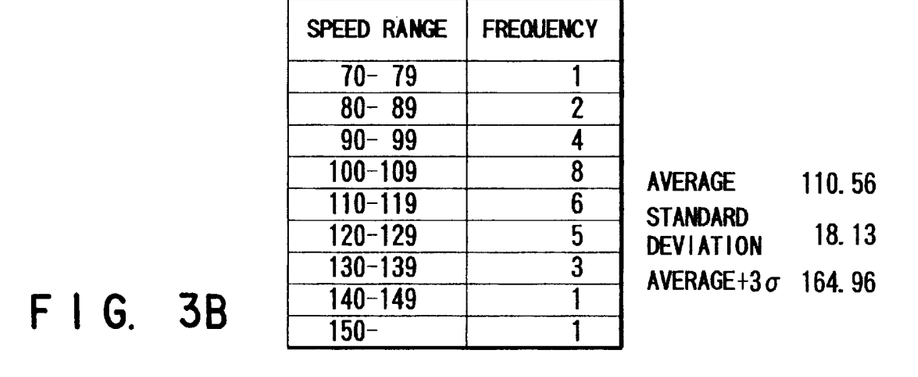
Figure 3C:
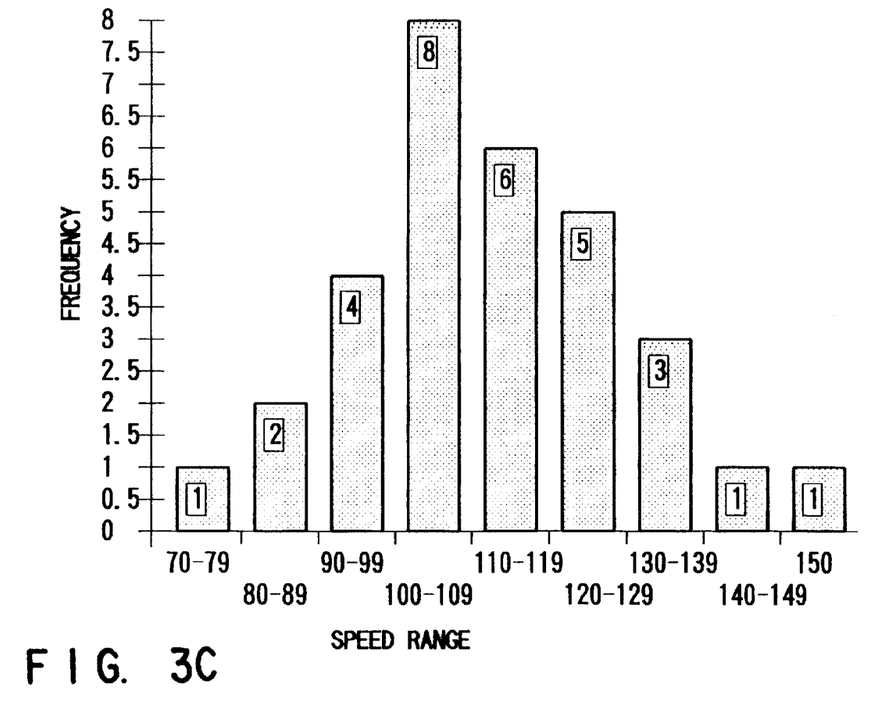

FIGS. 3B and 3C show more detailed data for adults. In these figures, a variance in maximum scan speeds in respective scan operations is plotted. The average of maximum values is about 111 mm/s. Even if the variance is considered, the maximum value is about 165 mm/s.

Figure 4:
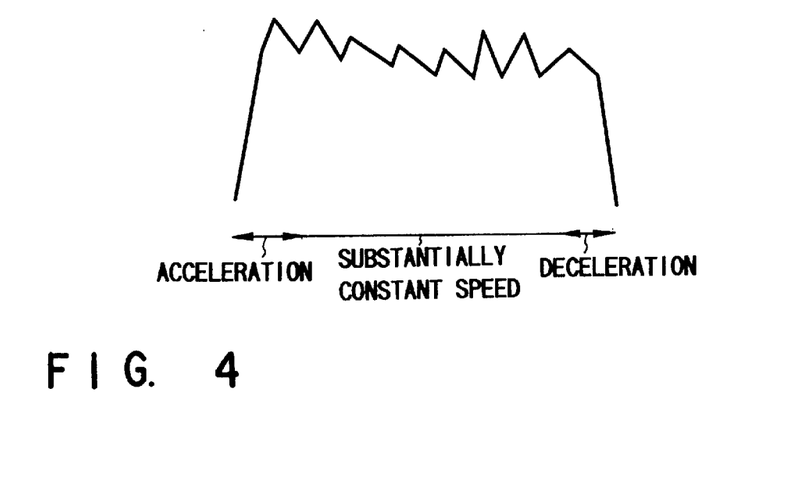
FIG. 4 shows a schematic speed pattern.

FIG. 4 schematically shows the variation in speed in a single scan operation. The variation in speed is expressed by a trapezoidal speed pattern comprising an acceleration component at the beginning of scan, a substantially constant speed component, and a deceleration speed component after the end of scan. The maximum scan speed is observed in the substantially constant speed component.

If the above facts and margins are considered, it will suffice that the code read apparatus is designed based on such specifications that the maximum speed is 160 to 200 mm/s and the scan speed ranges between the maximum value and substantially zero. Thus, the manual scan operation of the apparatus can be performed by the users from adults to children.

Figure 5A:
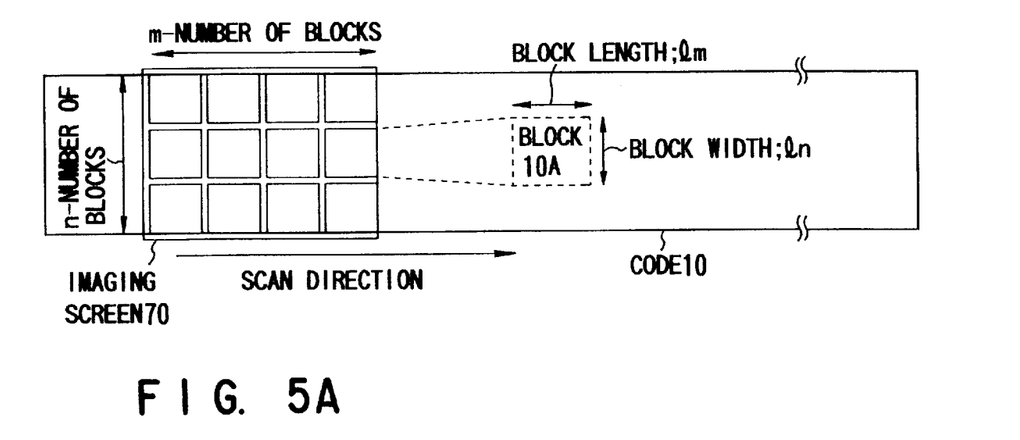
FIG. 5A illustrates a relationship between scanning and a code.
Figure 5B:
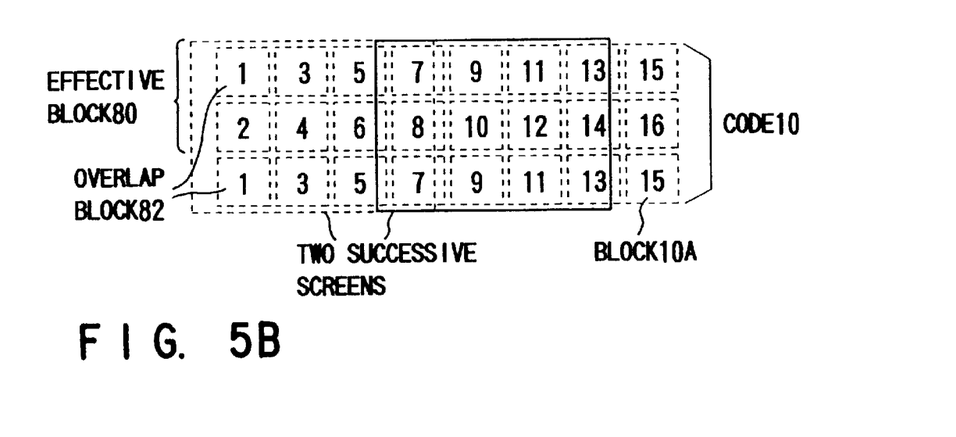
FIG. 5B illustrates successive imaging screens.

FIG. 5A shows the state of actual scanning. An imaging screen 70 of the area sensor 20A comprises m×n blocks 10A. For example, in FIG. 5B, the imaging screen 70 comprises 4×3 blocks. In FIG. 5B, numbers in the respective blocks indicate block addresses. A dot code 10 has a format in which at least one row of blocks within effective blocks 80 overlap. In this example, the blocks of the uppermost row and the blocks of the lowermost row are overlap blocks 82. Even if the position of the scanner is displaced vertically during manual scan due to motion of the hand, all blocks 10A can be imaged if the degree of displacement is within one block.

The distance of movement from a certain imaging screen to the next imaging screen will now be considered. Specifically, overlap between two successive screens is considered.

If the distance of overlap (in the scan direction) between a certain imaging screen and the next imaging screen is equal to greater than one block, irrespective of the number of blocks in the imaging screen, as shown in FIG. 5B, it will not occur that the block 10A is covered only in the defective state.

Figure 6A:
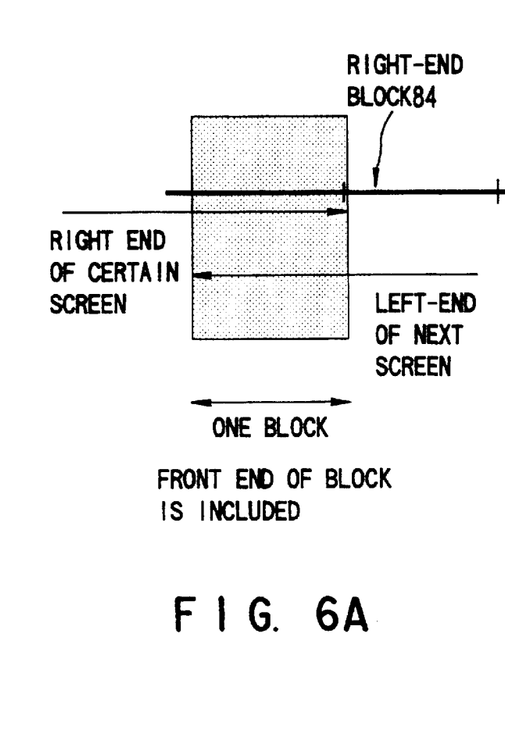
FIGS. 6A to 6C illustrates overlapping of imaging ranges.
Figure 6B:
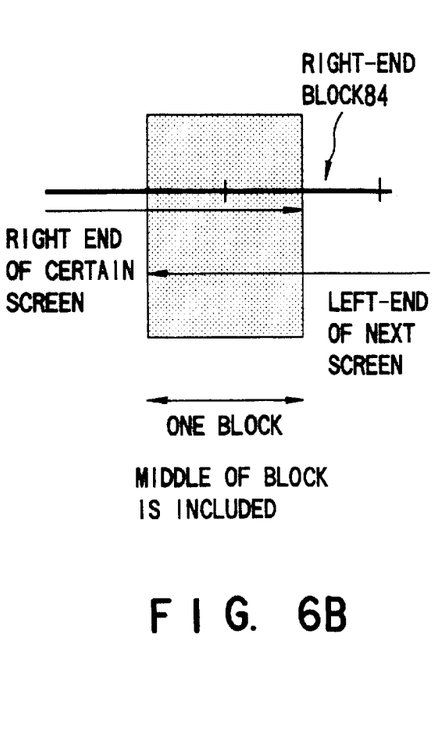
Figure 6C:
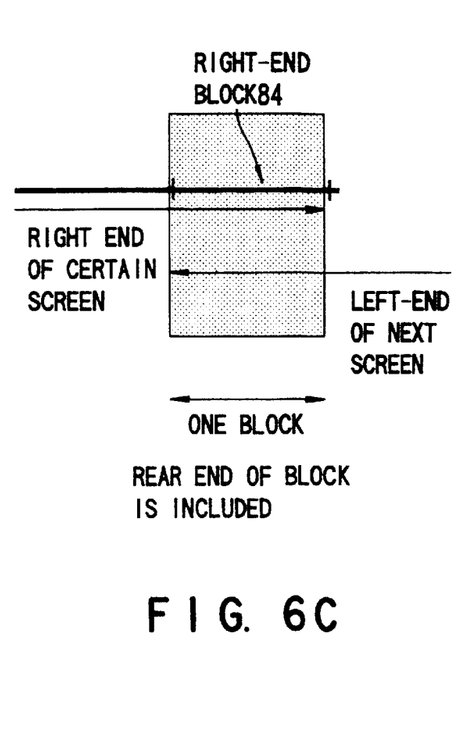

With reference to FIGS. 6A to 6C, it will now be described how the block located at the end of the screen in the scan direction is covered.

FIG. 6A shows the state in which coverage has reached a front portion of the right-end block 84 in a certain imaging screen. In this imaging screen, the right-end block 84 cannot be imaged. However, since there is overlap of one block in the next screen, the previous block is covered and thus the previously incompletely covered right-end block 84 is completely covered this time. Accordingly, the right-end block 84 can be imaged in the next imaging screen.

FIG. 6B shows the state in which coverage has reached to a middle portion of the right-end block 84 in a certain imaging screen. In this imaging screen, the right-end block 84 cannot be imaged. However, since there is overlap of one block in the next screen, the middle portion of the previous block is covered and thus the previously incompletely covered right-end block 84 is completely covered this time.

FIG. 6C shows the state in which the right-end block 84 in a certain imaging screen has been covered, except for a small right-end portion thereof. In this imaging screen, the right-end block 84 cannot be imaged because of the presence of the non-covered right-end portion. However, since there is overlap of one block in the next screen, the previous block is covered and thus the previously incompletely covered right-end block 84 is completely covered this time.

It is understood, from the above, that all blocks 10A can be imaged if there is an overlap of at least one block in the imaging screen 70 in the scan direction.

When an overlap is small, e.g. there is no overlap, perfect imaging of blocks requires execution of an imaging operation at the time the screen has moved by a distance of four blocks in the case where 4×3 blocks are contained in one screen, as shown in FIG. 5A. For this purpose, synchronization between the dot code 10 and the imaging device is necessary and the provision of marks, in addition to dot codes, is required. Otherwise, blocks are read only when the imaging timing coincides incidentally with the position of the scanner. In this case, the probability of reading of the code read apparatus is very low.

Accordingly, the code read apparatus of this embodiment is constructed such that there is an overlap of at least one block in the imaging screen 70 in the scan direction.

Specifically, this apparatus is designed in the following manner.

The above relation is expressed by $$V = \frac{(m-1)lm}{t} \qquad (1)$$

where V=the maximum scan speed at which codes can be read at the time of manual scanning, m=the number of blocks in one imaging screen in the scan direction, lm=the length of one block in the scan direction, and t=the imaging cycle.

Figure 7:
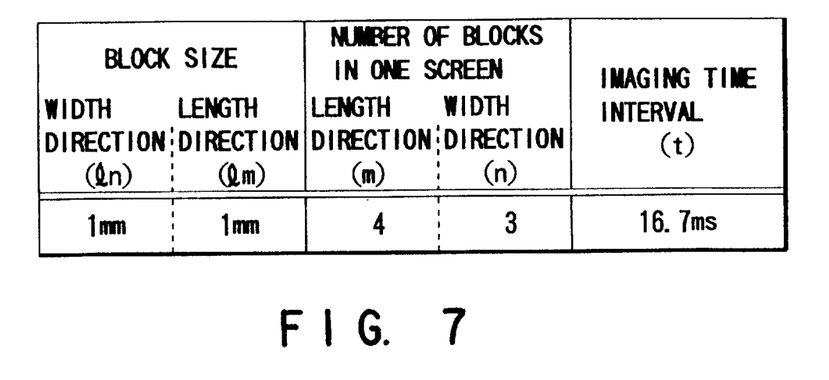
FIG. 7 shows simulated specifications of the dot code and code read apparatus.

Suppose that the dot code 10 and the imaging system have specifications, as shown in FIG. 7.

Figure 8:
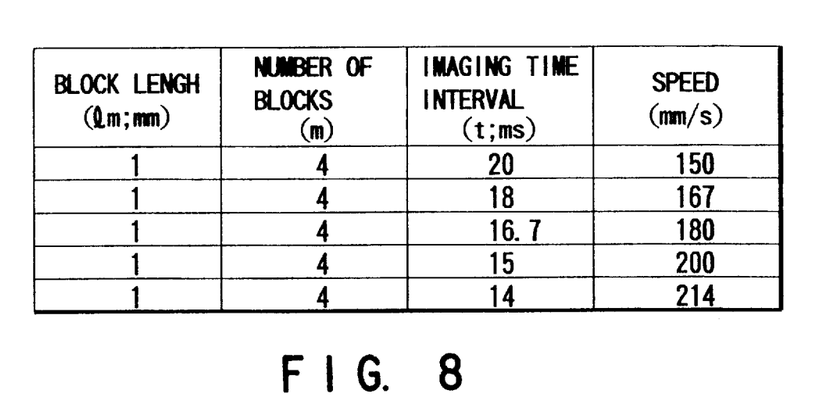
FIG. 8 shows performance with the simulated specifications shown in FIG. 7.

FIG. 8 shows data obtained when the values shown in FIG. 7 and various values of imaging cycle t, i.e. imaging time interval, were substituted in equation (1). As is seen from FIG. 8, if the specifications shown in FIG. 7 are adopted and the imaging time interval is set at 18 ms or less, the maximum scan speed of 160 to 200 mm/s is obtained. If a commercially available imaging device manufactured according to NTSC standard is used as area sensor 20A, the performance of 180 mm/s is obtained. In fact, the read-out rate of individual imaging devices is limited. However, if the read-out rate is increased as far as the imaging device permits, scanning can be achieved at higher speed.

In FIG. 8, the use of an imaging device of EIA specifications is supposed in the case where the imaging interval is 20 ms. In this case, the maximum speed is only about 150 mm/s.

Figure 9:
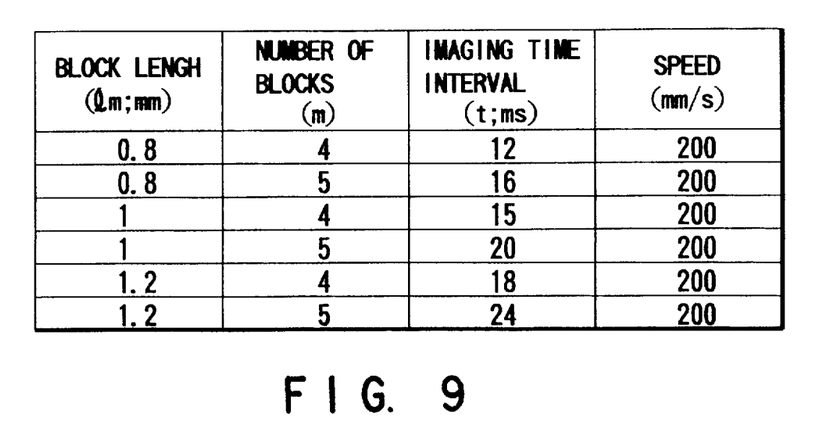
FIG. 9 shows combinations of parameters.

In the above case, variable parameters are the block size and the number of blocks in one screen. The former is determined by physical specifications of the format and it cannot be varied in some cases. The latter is determined by the number of pixels of the imaging device and the magnification of the optical system. For example, if the number of blocks in one screen in the scan direction is 5, the speed of 200 mm/s is achieved. FIG. 9 shows combinations of parameters, which can be realized by using commercially available standard imaging devices or by partially changing the specifications thereof.

In the code read apparatus of this embodiment, the specifications of the area sensor 20A and the first clock signal CLK1 generated by the clock generator 40 are determined according to the applied format of the dot code 10, so that the maximum scan speed of 160 mm/s to 200 mm/s, at which codes can be read at the time of manual scanning, is achieved and the imaging time interval satisfying the above equation (1) is set.

In the present embodiment, the imaging cycle t can be changed by the frequency indication section 50. If the user is a child and there is no need to perform scanning at high speed, it is possible to increase the imaging cycle, decrease the processing speed and reduce the power consumption (i.e. unnecessary design is avoided). Thereby, the interval of battery change in a battery-powered device can be increased.

Even if the imaging cycle t is increased, the operation speed of each part of the dot detection section 30 does not need to be increased if some processes are carried out in a pipeline manner. For example, if the dot image storage section 30A includes an image memory for two screens, the process for writing an image and the process for detecting marker 10E may be carried out by a first pipeline and the subsequent read point calculation process, read process and demodulation process may be carried out by a second pipeline. Thereby, all processes can be completed substantially within a time period for one imaging screen.

The embodiment of the invention has been described above, but this invention is not limited to the above embodiment. Various modifications may be made without departing from the scope of the invention. The subject matters of the invention may be summarized as follows:

(1) There is provided a manually scannable code read apparatus for reading, by manual scan, an optically readable code recorded on a recording medium, said code representing multimedia information including at least one of sound information, image information and text data, said apparatus comprising:

read means for optically reading said code from the recording medium; and process means for processing the code read by the read means and restoring the code to the multimedia information, wherein said read means is constructed such that a maximum scan speed of 160 mm/s to 200 mm/s, at which the code can be read at the time of manual scanning, is achieved.

Specifically, the code can be read at all speeds higher than zero and less than the allowable maximum speed of 160 mm/s to 200 mm/s. Thus, the code can be exactly read by any person in manual scan mode.

(2) There is provided a manually scannable code read apparatus for reading, by manual scan, an optically readable code recorded on a recording medium, said code representing multimedia information including at least one of sound information, image information and text data, said apparatus comprising:

read means for optically reading said code from the recording medium; and process means for processing the code read by the read means and restoring the code to the multimedia information, wherein said code is a two-dimensional code comprising a plurality of blocks having dot patterns arranged in accordance with the multimedia information, said read means includes an area sensor for imaging the code recorded on the recording medium, and block detection means for detecting the block on the basis of an output from the area sensor, and said read means is constructed such that a maximum scan speed V of 160 mm/s to 200 mm/s, at which the code can be read at the time of manual scanning, is achieved, said maximum scan s pee d V being given by equation (1), $$V = \frac{(m-1)lm}{t} \qquad (1)$$

where m=the number of blocks in one imaging screen in the scan direction, lm=the length of one block in the scan direction, and t=the imaging cycle.

Specifically, a b lock code having a predetermined size is imaged by the area sensor at predetermined time cycle. In this case, an overlap of one block is provided between two successive screens. Accordingly, the information in one imaging screen is hardly influenced by a variation in scan speed (if shutter time is sufficiently short, as compared to the scan speed). Thus, the code can exactly be read. In addition, all blocks are exactly read since the blocks are read at predetermined cycle with the overlap of one block.

(3) In the apparatus according to item (2), m, lm and t in the equation (1) satisfy the conditions:

$3 \leq m \leq 6$, lm≦4[mm], and t≦30[ms].

Specifically, the number of blocks in one imaging screen in the scan direction is set at 3 to 6, the length of each block in the scan direction is set at 4 mm or less, and the imaging cycle is set at 30 ms or less. Thus, the block code which can be formed in a regular printing process can be constructed by hardware using a regular TV imaging device and a simple optical system. Therefore, a cost-effective system is obtained.

(4) In the code read apparatus according to item (2) or (3), the length of an imaging range of the area sensor in a direction perpendicular to the code scan direction of the area sensor is, at least, not less than the total length of blocks containing effective multimedia information in said perpendicular direction, excluding the overlap block containing the same multimedia information as the effective multimedia information.

Specifically, the blocks are contained in one imaging screen in a direction perpendicular to the scan direction. Thus, a large quantity of data can be read by a single scanning operation in a one-dimensional direction.

(5) The code read apparatus according to item (2) further comprises imaging cycle changing/setting means for externally changing said imaging cycle t to a predetermined value and setting the changed imaging cycle t.

Specifically, the imaging time interval can be changed. If the user is a child and there is no need to perform scanning at high speed, it is possible to increase the imaging cycle, decrease the processing speed and reduce the power consumption (i.e. unnecessary design is avoided). Thereby, the interval of battery change in a battery-powered device can be increased.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A manual scanning code reading apparatus for reading, by manual scan, an optically readable code recorded on a recording medium, said code representing multimedia information including at least one of sound information, image information and text data, and said code reading apparatus comprising:

a reader for optically reading the code from the recording medium; and a processor for processing the code read by the reader and for restoring the code to the multimedia information, wherein:

said code comprises a two-dimensional code including a plurality of blocks having dot patterns arranged in accordance with the multimedia information, said reader includes an area sensor for imaging the code, and a detector for detecting at least one of the plurality of blocks of the code based on an output from the area sensor, and said reader is operable for reading the code at a maximum scan speed V of 160 mm/s to 200 mm/s, said maximum scan speed V being given by:

$$V = \frac{(m-1)lm}{t}$$

where m=a number of blocks in one imaging screen in a scan direction, lm=a length of one block in the scan direction, and t=an imaging cycle.

2. The code reading apparatus according to claim 1, wherein a length of an imaging range of the area sensor in a direction perpendicular to the scan direction is not less than a total length of blocks containing effective multimedia information in said perpendicular direction, excluding an overlap block containing multimedia information which is identical to the effective multimedia information.

3. The code reading apparatus according to claim 1, further comprising imaging cycle changing/setting means for externally changing said imaging cycle t to a predetermined value and setting the changed imaging cycle t.

4. The code reading apparatus according to claim 1, wherein:

3≦m≦6, lm≦4 mm, and t≦30 ms.

5. The code reading apparatus according to claim 4, wherein a length of an imaging range of the area sensor in a direction perpendicular to the scan direction is not less than a total length of blocks containing effective multimedia information in said perpendicular direction, excluding an overlap block containing multimedia information which is identical to the effective multimedia information.

* * * * *